United States Patent
Ko et al.

(10) Patent No.: US 7,227,224 B2
(45) Date of Patent: Jun. 5, 2007

(54) MOS TRANSISTOR WITH ELEVATED SOURCE AND DRAIN STRUCTURES AND METHOD OF FABRICATION THEREOF

(75) Inventors: Young-gun Ko, Sungnam (KR); Chang-bong Oh, Sungnam (KR)

(73) Assignee: Samsung Electronics Co., Ltd. (KR)

( * ) Notice: Subject to any disclaimer, the term of this patent is extended or adjusted under 35 U.S.C. 154(b) by 173 days.

(21) Appl. No.: 10/697,826

(22) Filed: Oct. 30, 2003

(65) Prior Publication Data

US 2004/0169221 A1    Sep. 2, 2004

(30) Foreign Application Priority Data

Feb. 28, 2003    (KR)    ............. 10-2003-0012793

(51) Int. Cl.
  *H01L 29/76*    (2006.01)
(52) U.S. Cl. .............. 257/330; 257/382; 257/384
(58) Field of Classification Search ........ 257/330, 257/377, 382, 900, 327, 332, 333, 334, 383, 257/384, 385
See application file for complete search history.

(56) References Cited

U.S. PATENT DOCUMENTS

| | | | | |
|---|---|---|---|---|
| 4,513,303 | A | * | 4/1985 | Abbas et al. ............. 257/327 |
| 5,144,393 | A | * | 9/1992 | Yamaguchi et al. ....... 257/327 |
| 5,168,072 | A | * | 12/1992 | Moslehi ................. 438/300 |
| 6,051,473 | A | | 4/2000 | Ishida et al. ............ 438/300 |
| 6,087,235 | A | | 7/2000 | Yu ...................... 438/300 |
| 6,093,947 | A | | 7/2000 | Hanafi et al. ............ 257/330 |
| 6,278,164 | B1 | | 8/2001 | Hieda et al. ............. 257/410 |
| 6,376,318 | B1 | * | 4/2002 | Lee et al. ............... 438/300 |
| 6,528,847 | B2 | * | 3/2003 | Liu ..................... 257/330 |
| 6,548,875 | B2 | * | 4/2003 | Nishiyama .............. 257/377 |
| 2002/0037619 | A1 | | 3/2002 | Sugihara et al. .......... 438/289 |
| 2002/0045317 | A1 | | 4/2002 | Oishi et al. ............. 438/300 |
| 2002/0072181 | A1 | | 6/2002 | Tseng ................... 438/300 |
| 2002/0117725 | A1 | | 8/2002 | Oowaki et al. ........... 257/410 |
| 2002/0171107 | A1 | * | 11/2002 | Cheng et al. ............ 257/347 |
| 2005/0164433 | A1 | * | 7/2005 | Doris et al. ............. 438/149 |

FOREIGN PATENT DOCUMENTS

| | | |
|---|---|---|
| JP | 10-189966 | 7/1998 |
| JP | 2002-94051 | 3/2002 |
| JP | 2002-100762 | 4/2002 |
| JP | 2002-124665 | 4/2002 |
| KR | 980033205 | 7/1996 |
| KR | 2001-0064118 | 7/2001 |
| KR | 1020020003625 | 1/2002 |
| KR | 10-0344733 | 7/2002 |

* cited by examiner

*Primary Examiner*—Sara Crane
(74) *Attorney, Agent, or Firm*—Mills & Onello LLP

(57) ABSTRACT

A transistor and method of formation thereof includes source and drain extension regions in which the diffusion of dopants into the channel region is mitigated or eliminated. This is accomplished, in part, by elevating the source and drain extension regions into the epitaxial layer formed on the underlying substrate. In doing so, the effective channel length is increased, while limiting dopant diffusion into the channel region. In this manner, performance characteristics of the transistor can be accurately determined by controlling the respective geometries (i.e. depths and widths) of the source/drain extension regions, the source/drain regions, the channel width and an optional trench formed in the underlying substrate. In the various embodiments, the source/drain regions and the source/drain extension regions may extend partially, or fully, through the epitaxial layer, or even into the underlying semiconductor substrate.

21 Claims, 12 Drawing Sheets

MOS TRANSISTOR WITH ELEVATED SOURCE AND DRAIN STRUCTURES AND METHOD OF FABRICATION THEREOF

BACKGROUND OF INVENTION

In the semiconductor industry, minimization of the feature size of MOS transistors in integrated circuits is a common goal. This goal is essentially driven by the need to produce integrated circuits at ever-lower costs, while improving circuit functionality and speed. Such downscaling can be achieved by reducing the characteristic dimensions of the transistors, i.e. reducing the gate lengths, the gate oxide thickness, and the junction depths, and by increasing the channel doping levels. However, scaled-down MOS transistors generally suffer from a phenomenon referred to as the "short-channel effect". The short-channel effect has an adverse impact on the switching performance of the transistors, because such switching is inefficiently controlled by the gate electrode, which leads to an undesired decrease in the threshold voltage. Mechanically, the depletion regions around the source and the drain occupy an increasingly large fraction of the channel region, so that a lower potential on the gate is needed to achieve inversion in the channel.

Referring to the FIG. 1, a conventional scaled-down MOS transistor 100, which is fabricated within a semiconductor substrate 102, includes a source extension region 106a and a drain extension region 106b. The source extension region 106a and the drain extension region 106b have shallow junctions in order to minimize the short-channel effect that occurs in MOS transistors having sub-micron or nanometer dimensions. The MOS transistor 100 further includes a source region 108a and a drain region 108b that have deeper junctions, relative to the source extension region 106a and the drain extension region 106b, to provide lower resistance. The MOS transistor 100 also includes a gate structure 110, which is comprised of a gate dielectric 112 and a gate electrode 114. An insulative spacer 118, which is typically comprised of silicon nitride (SiN), is disposed on the sidewalls of the gate structure 110. The MOS transistor 100 further includes silicide regions 120a, 120b, and 120c to provide low-resistance electrical contact with the source/drain 106a/106b and the gate electrode 114. The MOS transistor is electrically isolated from other devices by shallow trench isolation structures 104.

A problem lies in that impurities in the source/drain extension regions 106a/106b tend to diffuse to the region immediately under the gate 110. The portions of the source/drain extension regions 106a/106b formed immediately under the gate 110 have a higher electric resistance relative to the portions of the extension regions 106a/106b located immediately under the sidewall spacers 118. For this reason, the transistor 100 has effective resistances R that are connected in series to the source and the drain. This inhibits the flow of electric current, thus decreasing operation speed.

A second problem concerns the rise of channel dopant concentration, which in turn causes a rise in threshold voltage in the field effect transistor. In order to meet miniaturization requirements in MOS transistors, the impurity concentration of the channel impurity region is necessarily raised. At the same time, contemporary semiconductor devices are designed to operate with a lower power supply voltage, such as ranging from 5V to 3.3V. For operation with such a low power supply voltage, the threshold voltage of the field effect transistor needs to be lower. For this reason, any rise in the threshold voltage of MOS transistor due to the rise in channel dopant concentration is undesirable. On the other hand, a channel doping level that is too high in scaled-down devices gives rise to superfluous leakage current and junction breakdown.

In an attempt to overcome the stated disadvantages, elevated source and drain structures have been suggested. Referring to FIG. 2, a gate structure 210 comprised of a gate dielectric 212 and a gate electrode 214 is formed on the surface of the semiconductor substrate 202. A source extension region 206a and a drain extension region 206b are then formed in the semiconductor substrate. A spacer 218, typically comprised of silicon nitride (SiN), is formed on the sidewalls of the gate structure 210. An epitaxial layer 205, typically comprised of silicon, is grown on the exposed portions of the source/drain extension regions 206a/206b, typically using selective epitaxial growth. Following the growth of the epitaxial layer 205, dopants are implanted and activated to form an elevated source 208a and an elevated drain 208b. The MOS transistor 200 further includes silicide regions 220a, 220b, and 220c to provide electrical contacts to the elevated source/drain regions 208a/208b and the gate electrode 214.

A MOS transistor having an elevated source/drain produced according to the structure of FIG. 2 is effective for reducing the resistance of the source and drain regions by increasing the thickness and the doping level by elevating the source/drain regions 208a/208b. However, it is inevitable that the dopants of the source/drain extension regions 206a/206b diffuse into the region immediately under the gate 210, which result in junction leakage current through the source/drain extension regions 206a/206b.

SUMMARY OF THE INVENTION

The present invention is directed to a MOS transistor having elevated source and drain structures, and a method of formation thereof, that overcomes the limitations of the conventional embodiments. In particular, the present invention provides for a transistor that includes source and drain extension regions in which the diffusion of dopants into the channel region is mitigated or eliminated. This is accomplished, in part, by elevating the source and drain extension regions into the epitaxial layer formed on the underlying substrate. In doing so, the effective channel length is increased, while limiting dopant diffusion into the channel region.

The performance characteristics of the transistor of the present invention can be accurately determined by controlling the respective geometries (i.e. depths and widths) of the source/drain extension regions, the source/drain regions, the channel width and an optional trench formed in the underlying substrate. In the various embodiments, the source/drain regions and the source/drain extension regions may extend partially, or fully, through the epitaxial layer, or even into the underlying semiconductor substrate.

In one aspect, the present invention is directed to a method for forming a MOS transistor having elevated source and drain structures. A sacrificial gate pattern is provided on a substrate. An epitaxial layer is provided on the substrate adjacent the sacrificial gate pattern. A silicon nitride film and a silicon oxide film are provided on the epitaxial layer adjacent the sacrificial gate pattern. The sacrificial gate pattern is removed to expose a portion of the substrate and wall portions of the epitaxial layer. A gate dielectric layer is provided on the exposed portion of the substrate and along the wall portions of the epitaxial layer. A gate electrode is provided on the gate dielectric layer. The silicon oxide film and silicon nitride film are removed. The epitaxial layer is doped with impurities using the gate electrode as a mask to form source/drain extension regions in the epitaxial layer proximal to the gate dielectric layer. Insulating spacers are provided on sidewalls of an upper portion of the gate electrode. The epitaxial layer is doped with impurities using the gate electrode and insulating spacers as a mask to form deep source/drain regions adjacent the source/drain extension regions.

In one embodiment, the source/drain extension regions are formed by doping the epitaxial layer with impurities prior to providing the silicon nitride film and silicon oxide film on the epitaxial layer. Providing the sacrificial gate pattern may comprise sequentially forming a silicon oxide film and a silicon nitride film and patterning the sequentially formed films to form the sacrificial gate pattern.

The substrate is, for example, of a type selected from the group consisting of: silicon; silicon-on-insulator (SOI); SiGe; SiGe-on-insulator(SGOI); strained silicon; strained silicon-on-insulator; and GaAs. The substrate is optionally formed of a material of a first conductivity type and the impurities used for doping the epitaxial layer are of a second conductivity type opposite that of the first conductivity type. A pad oxide layer may be formed on the epitaxial layer.

The step of providing a silicon nitride film and a silicon oxide film on the epitaxial layer adjacent the sacrificial gate pattern may comprise: sequentially providing a silicon nitride film and a silicon oxide film on the epitaxial layer and the sacrificial gate pattern; and planarizing the silicon nitride film, silicon oxide film and sacrificial gate pattern to expose an upper surface of the sacrificial gate pattern. The silicon oxide film is provided, for example, by a chemical vapor deposition (CVD) process. The step of planarizing comprises, for example, planarizing by a chemical-mechanical polishing process (CMP) or an etch-back treatment.

Removal of the sacrificial gate pattern comprises etching the sacrificial gate pattern to expose an upper surface of the substrate, or, optionally, forming a recess in the substrate, in which case the gate dielectric layer is formed on bottom and side walls of the recess of the substrate. The recess is preferably of a depth that is less than 50 nm.

The exposed portion of the substrate may be doped with impurities to form a channel region following removal of the sacrificial gate pattern, or, optionally, prior to providing the sacrificial gate pattern on the substrate, the channel region corresponding to an area of the substrate covered by the sacrificial gate pattern.

The gate dielectric layer preferably comprises a material selected from the group of materials consisting of: silicon oxide film; silicon oxy-nitride (SiON); tantalum oxide; and a high-dielectric-constant material.

The step of providing the gate electrode comprises, for example, forming a gate electrode material film on the gate dielectric layer and the silicon oxide film; and planarizing the gate electrode material film and silicon oxide film. Planarizing comprises, for example, planarizing by a chemical-mechanical polishing process (CMP) or an etch-back treatment.

The gate electrode comprises a material selected from the group of materials consisting of: polysilicon film; silicon geranium film; silicide film; metal film; and a laminate film. The step of removing the silicon oxide film and silicon nitride film comprises removing using a wet etching process.

The step of providing insulating spacers on sidewalls of an upper portion of the gate electrode comprises, for example, providing a silicon nitride film on the resultant structure; and anisotropically etching the silicon nitride film. Prior to providing the silicon nitride film, a silicon oxide buffer layer may be provided on the resultant structure.

Doping the epitaxial layer with impurities using the gate electrode and insulating spacers as a mask to form source/drain regions adjacent the source/drain extension regions comprises, for example, doping with impurities of a same conductivity type as that of the source/drain extension regions.

A silicide film may optionally be formed on the source/drain regions and the gate electrode. The silicide film comprises, for example, a cobalt silicide film.

The source/drain extension regions are formed, for example, to a first depth and the deep source/drain regions are formed to a second depth. In one example, the first depth is less than the second depth. The deep source/drain regions and/or the source/drain extension regions may optionally extend into the substrate.

Trench isolation structures in the substrate may be formed on opposite sides of the deep source/drain regions, for example, according to a shallow trench isolation process.

In another aspect, the present invention is directed to a MOS transistor having elevated source and drain structures. A gate dielectric layer is provided on a substrate. A gate electrode is provided on the gate dielectric layer. An epitaxial layer is provided adjacent the gate dielectric layer on the substrate. First source/drain regions are provided in the epitaxial layer adjacent the gate dielectric layer at lower side portions of the gate electrode.

In one example, the gate dielectric layer extends across a bottom portion and the lower side portions of the gate electrode; The first source/drain regions are formed by doping the epitaxial layer with impurities. The substrate is formed of a material of a first conductivity type and wherein the impurities used for doping the epitaxial layer are of a second conductivity type opposite that of the first conductivity type.

Insulating spacers may be provided on the epitaxial layer at an upper side portion of the gate electrode; and second source/drain regions may be provided adjacent the first source/drain regions opposite the gate electrode. In this case, the second source/drain regions are formed, for example, by doping exposed surfaces with impurities using the gate electrode and insulating spacers as a mask. The first source/drain regions comprise source/drain extension regions and the second source/drain regions comprise deep source/drain regions. The first source/drain regions are formed to a first depth in the epitaxial layer and the second source/drain regions are formed to a second depth. The first depth is, in one example, less than the second depth. The first source/drain regions and/or the second source/drain regions may optionally extend into a portion of the substrate.

The substrate may be formed of a type selected from the group consisting of: silicon; silicon-on-insulator (SOI); SiGe; SiGe-on-insulator(SGOI); strained silicon; strained silicon-on-insulator; and GaAs. The epitaxial layer may comprise silicon.

The gate dielectric layer and gate electrode extend into a trench formed in an upper portion of the substrate. In one example, the trench is of a depth that is less than 50 nm.

A channel region is formed in the substrate under the gate electrode and adjacent the lower side portions of the gate electrode.

The gate dielectric layer comprises a material selected from the group of materials consisting of: silicon oxide film; silicon oxy-nitride (SiON); tantalum oxide; and a high-dielectric-constant material. The gate electrode comprises a material selected from the group of materials consisting of polysilicon film; silicon geranium film; silicide film; metal film; and a laminate film. A silicon oxide buffer layer may be provided between the gate electrode and the insulating spacers. A silicide film, for example comprising a cobalt silicide film, may be formed on the source/drain regions and the gate electrode.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 1:
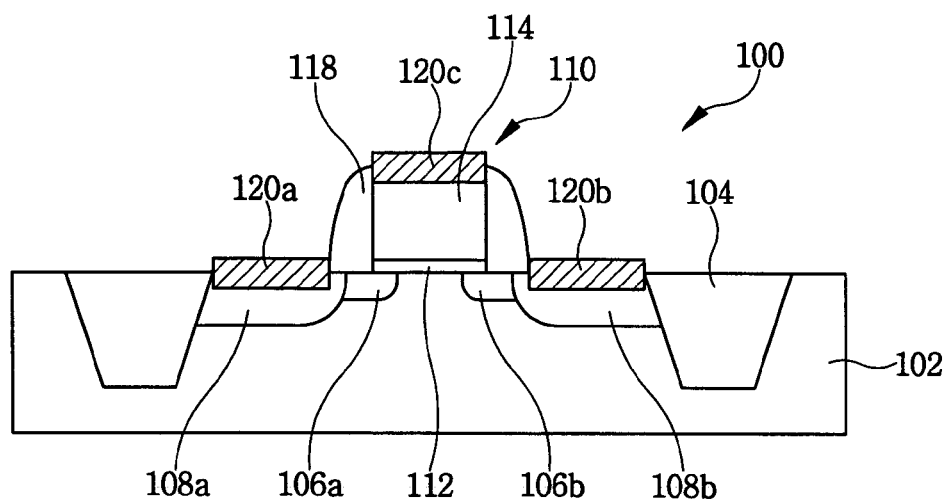
FIG. 1 is a cross-sectional schematic view of a conventional MOS transistor.
Figure 2:
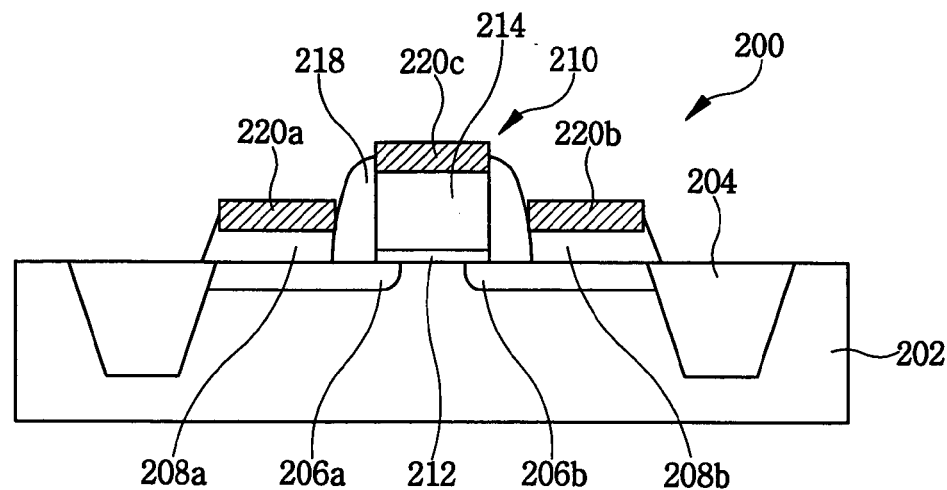
FIG. 2 is a cross-sectional schematic view of a conventional MOS transistor having elevated source and drain regions.
Figure 3:
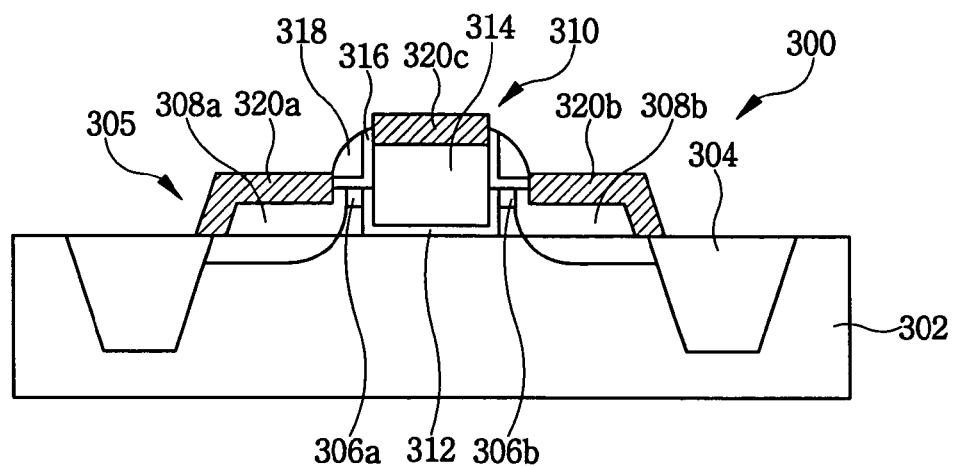
FIG. 3 is a cross-sectional schematic view of a MOS transistor having elevated source and drain regions, in accordance with a first embodiment of the present invention.

A MOS transistor structure 300 according to the present invention is illustrated in FIG. 3. A gate electrode 314 is formed over a semiconductor substrate 302 to form a gate 310. A gate dielectric 312, for example formed of silicon oxide (SiO$_2$), is formed under the gate electrode 314 and at the lower portions of the sidewalls of the gate electrode 314. An epitaxial layer 305, for example comprising silicon or silicon germanium, is formed on the substrate 302 adjacent opposite sides of the gate 310. An insulative spacer 318,is formed at the upper portions of the sidewalls of the gate 310. In the epitaxial layer 305, a source extension region 306a and a drain extension region 306b are formed under the spacers 318. A source 308a and a drain 308b are formed on the exposed portions of the source/drain extension regions 306a/306b, i.e. portions of the epitaxial regions that do not lie under the spacers 318. The MOS transistor 300 may further optionally include silicide regions 320a, 320b, and 320c to provide low-resistance electrical contacts for the elevated source/drain 306a/306b and the gate electrode 314.

The insulative spacer 318 is comprised, for example, of silicon nitride (SiN). In addition, an optional silicon oxide layer 316 may be formed as a buffer layer between the SiN spacer 318 and other silicon layers such as the gate electrode 314 and epitaxial layer 305.

Figure 4:
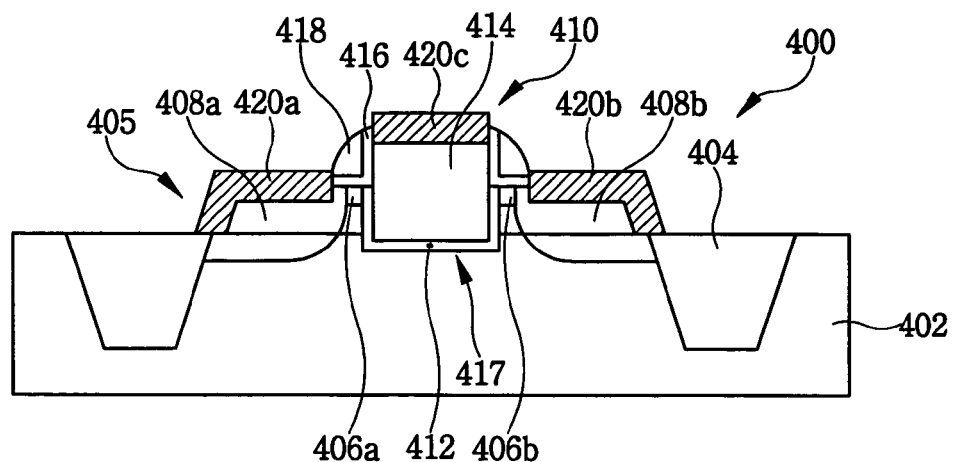
FIG. 4 is a cross-sectional schematic view of a MOS transistor having elevated source and drain regions, in accordance with a second embodiment of the present invention.

With reference to FIG. 4, the gate electrode 414 may optionally be formed in a trench 417 or a recessed portion, of the semiconductor substrate 402, as shown. In this case, the gate dielectric 412 is partially formed under, and at the lower portions of, the sidewalls of the gate electrode, for example, on the bottom and side surfaces of the gate trench 417 of the semiconductor substrate 402 and at the sidewalls of the epitaxial layer 405 as shown. The trench embodiment of FIG. 4 provides for an effective lengthening of the channel region between the source and drain extension regions 406a, 406b.

The effective channel length of the transistor structure of the present invention can be varied by controlling several factors, including the thickness of the. epitaxial layer 305 (405), the depth of the source/drain extension regions 306a/306b (406a/406b), the depth of the source/drain regions 308a/308b (408a/408b), and the depth of the gate trench 417.

Figure 5:
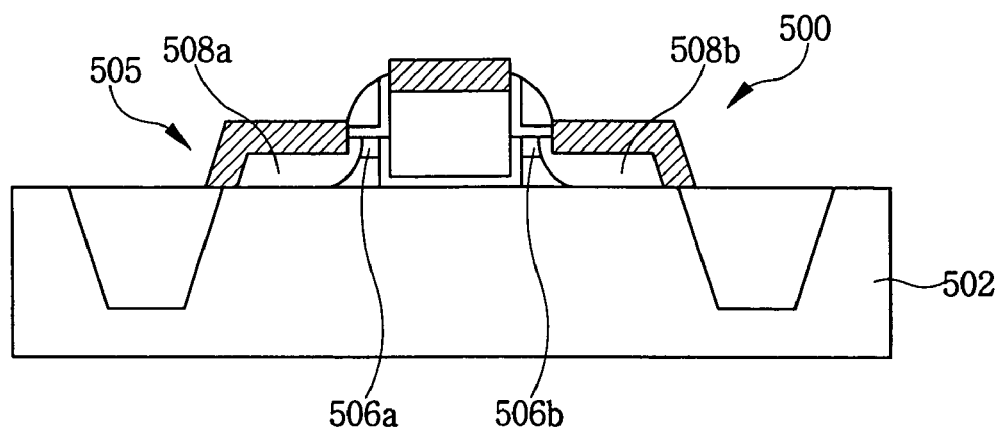
FIGS. 5, 6 and 7 are cross-sectional schematic views of MOS transistors having elevated source and drain regions, wherein the source and drain regions and the source and drain extension regions are of various depths, in accordance with the present invention.
Figure 6:
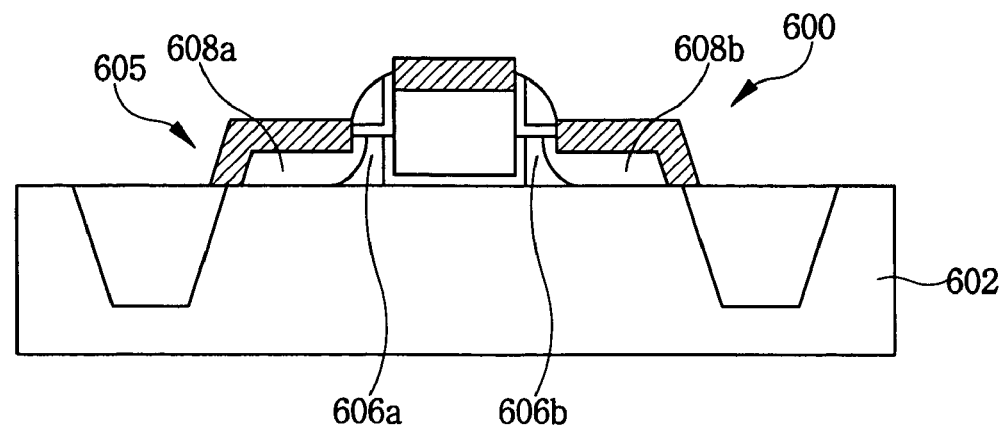
Figure 7:
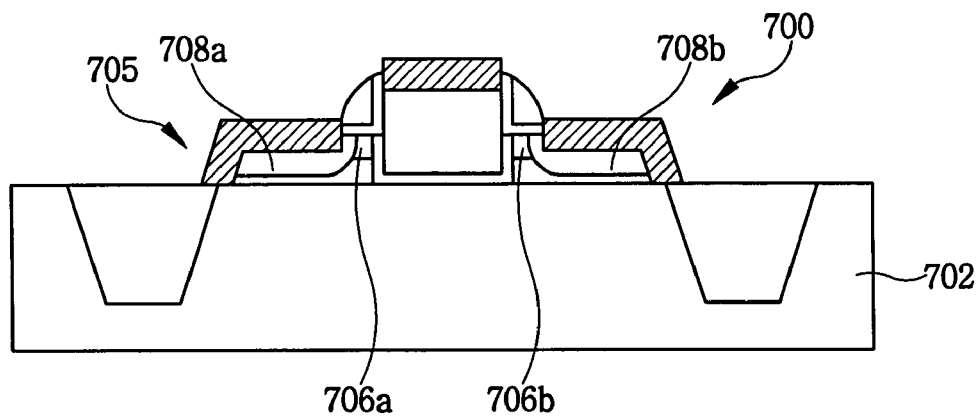

In the exemplary embodiments of FIGS. 3 and 4, the depths of the source/drain regions 308a/308b (408a/408b) extend into the semiconductor substrate 302 (402) as shown. Optionally, the depths of the source/drain extension regions 306a/306b (406a/406b) may also extend into the semiconductor substrate 302 (402) (not shown). In the example of FIG. 5, the source/drain regions 508a/508b extend to the boundary between the epitaxial layer 505 and the semiconductor substrate 502, while the source/drain extension regions 506a/506b extend partially through the epitaxial layer 505. In the example of FIG. 6, the source/drain regions 608a/608b extend to the boundary between the epitaxial layer 605 and the semiconductor substrate 602, and the source/drain extension regions 606a/606b also extend to the boundary between the epitaxial layer 605 and the semiconductor substrate 602. In the example of FIG. 7, the source/drain regions 708a/708b partially extend through the epitaxial layer 705, and the source/drain extension regions 706a/706b also partially extend through the epitaxial layer 705 to a depth that is different than that of the source/drain regions 708a/708b.

By controlling the channel length, various device characteristics can be achieved, and the short-channel effect can be prevented, despite the need for down-scaling of device size. In a conventional transistor, the channel length is controlled primarily by the gate length; however, in the transistor of the present invention, the channel length is not only controlled by the gate length but also controlled according to the thickness of the epitaxial layer, the depth of the source/drain regions, and the depth of the gate trench.

According to the present invention, with reference to FIG. 3, since the impurities in the source/drain extension regions 306a/306b are located in the epitaxial layer 305, the impurities will not diffuse into the region under the gate 310, as in the conventional embodiments, even following a heat treatment of the silicon substrate 302. In this manner, shortening of the channel length relative to the gate length is prevented. Furthermore, the channel length can be variably lengthened to include the lower sidewall of the gate as well as the region located immediately under the gate electrode by controlling the thickness of epitaxial layer 305, the depth of the source/drain extension regions 306a/306b in the epitaxial layer, or the depth of the gate trench 417 in the semiconductor substrate. In this manner, a channel of sufficient length can be achieved in a transistor structure that includes a minimized gate length.

According to the present invention, the concentration distribution of impurities in the channel region between the source extension region and the drain extension region can be precisely controlled. As a result, the resulting threshold voltage of a MOS transistor can be accurately predicted, and, accordingly, a semiconductor device having optimal electrical characteristics can be obtained.

Rise in the threshold voltage of the MOS transistor can be restrained, for example, by forming source/drain regions 308a/308d in the epitaxial layer 305 to have lower impurity concentrations, thereby affording compatibility with a decrease in the power supply voltage of the semiconductor device.

Figure 8A:
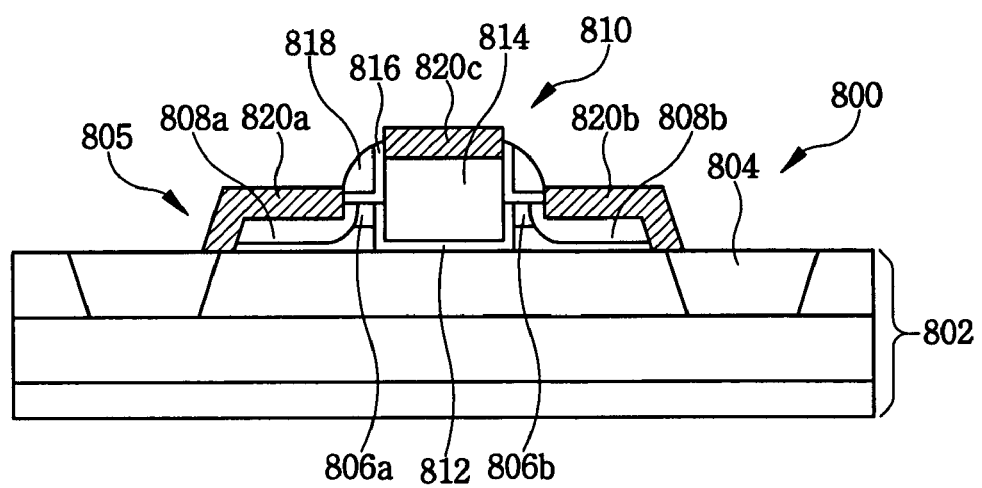
FIGS. 8A and 8B are cross-sectional schematic views of MOS transistor having elevated source and drain regions, in accordance with the first and second embodiments of the present invention formed on an silicon-on-insulator (SOI) substrate.
Figure 8B:
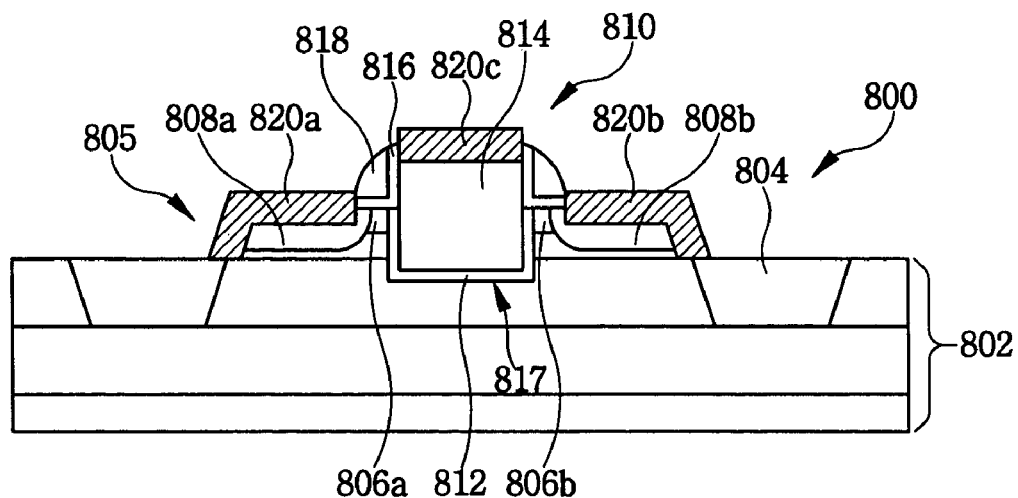

The material of the semiconductor substrate is not limited to silicon, but may comprise any of a number of other semiconductor materials or configurations including silicon-on-insulator (SOI), SiGe, SiGe-on-insulator (SGOI), strained silicon (silicon-on-SiGe), strained silicon-on-insulator, and GaAs. A cross-sectional schematic view of an embodiment of the present invention, where a MOS transistor is formed on an SOI substrate 702, is shown in FIGS. 8A and 8B. In the FIG. 8A embodiment, the MOS transistor 700 formed on an SOI substrate 702 includes a gate 710 that is formed on the SOI substrate 702, as in the embodiment of FIG. 3. In the FIG. 8B embodiment, the MOS transistor 800 formed on an SOI substrate 802 includes a gate 810 that is formed in a trench 817 formed in the SOI substrate 802, as in the embodiment of FIG. 4. In this manner, the transistor 700, 800 in accordance with the present invention is fully compatible with SOI fabrication processes. As such, the thickness of the channel impurity region in the transistor can be maintained or decreased dramatically, while increasing the junction depths of the resultant elevated source/drain regions.

In an SOI device, the depth of the source/drain regions becomes shallow, since the thickness of the surface silicon is relatively shallow. As a result, the resulting resistance of the source/drain region increases. The present invention alleviates this problem, since the source/drain regions have adequate depth by virtue of the epitaxial layer.

The gate dielectric 312, 412, may be formed of silicon oxide film, as stated above, or alternatively, silicon-oxynitride (SiON). Alternatively, a film comprising a high-dielectric-constant material such as tantalum oxide may be used. The gate dielectric layer may be formed, for example, in a deposition process, or, alternatively, in a thermal oxidation process. For the gate electrode, a silicon germanium film, a silicide film, or a metal film, for example, may be used instead of the polysilicon film. Optionally, a laminate film of the above materials may be used.

A first embodiment of the present invention is shown and described above with reference to FIG. 3. A method of fabricating a semiconductor device according to the first embodiment of the present invention will now be described with reference to FIGS. 9A–9L.

Figure 9A:
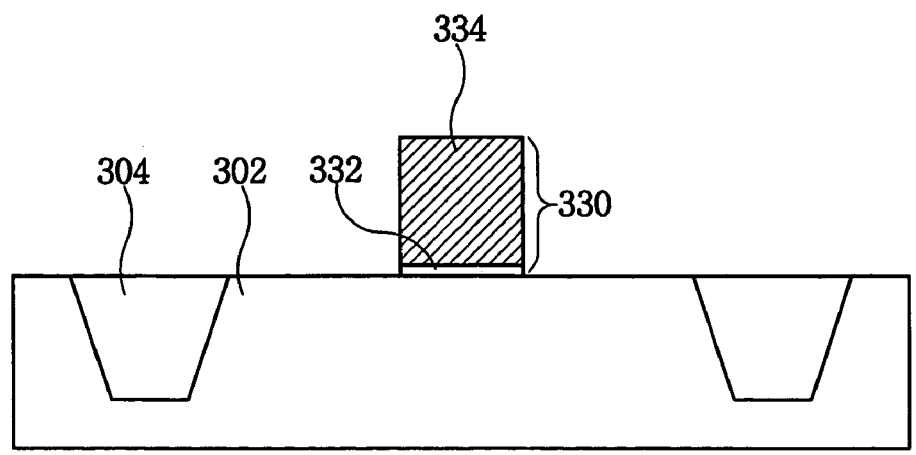
FIGS. 9A–9L are cross-sectional schematic views of a method for fabricating the MOS transistor of the first embodiment of the present invention.

Initially, referring to FIG. 9A, an element isolation film 304 is formed in a silicon substrate 302, for example, by a shallow trench isolation method. Next, impurities are doped into the silicon substrate 302, so as to form a well region and a channel impurity region (not shown). Next, a silicon oxide film 332 and a silicon nitride film 334 are sequentially formed on the silicon substrate 302 and are subjected to anisotropic etching in order to form a dummy gate electrode 330.

Figure 9B:
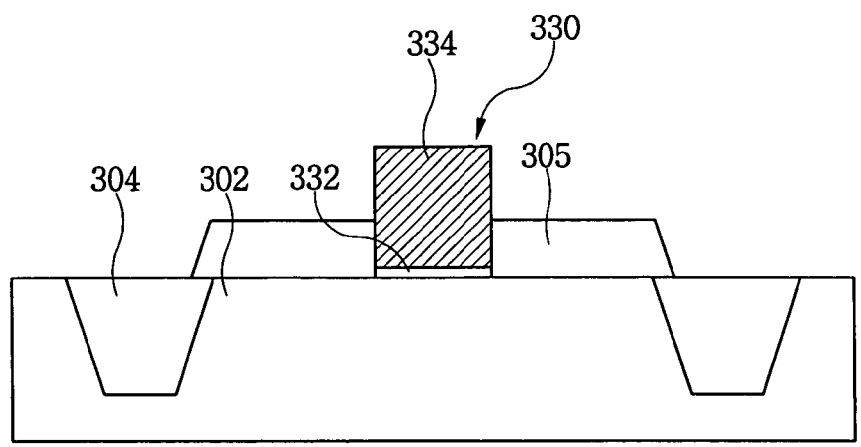

Next, referring to FIG. 9B, an epitaxial layer 305 is selectively grown on the substrate 302 on sides of the dummy gate 330. For example selective epitaxial growth (SEG) may be used to form the epitaxial layer 305 such that it is formed on the surface of the silicon substrate and not on the silicon nitride 334 layer or oxide trench isolation elements 304. The epitaxial layer 305 may optionally be doped at this stage to form the source/drain extension regions, or alternatively, may remain un-doped at this stage. In a preferred embodiment, doping of the source/drain extension regions follows formation of the gate electrode, as described below with reference to FIG. 9I. If the epitaxial layer is doped at this stage, an optional pad oxide layer (not shown) is provided on the epitaxial layer 305 as a buffer layer, in order to protect the epitaxial layer during implantation of dopants. The optional pad oxide layer may be grown by thermal oxidation.

Figure 9C:
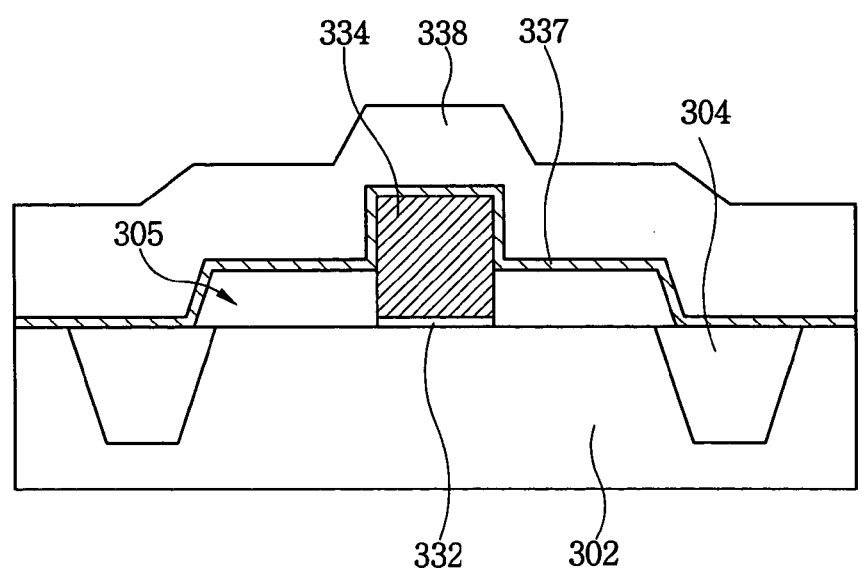
Figure 9D:
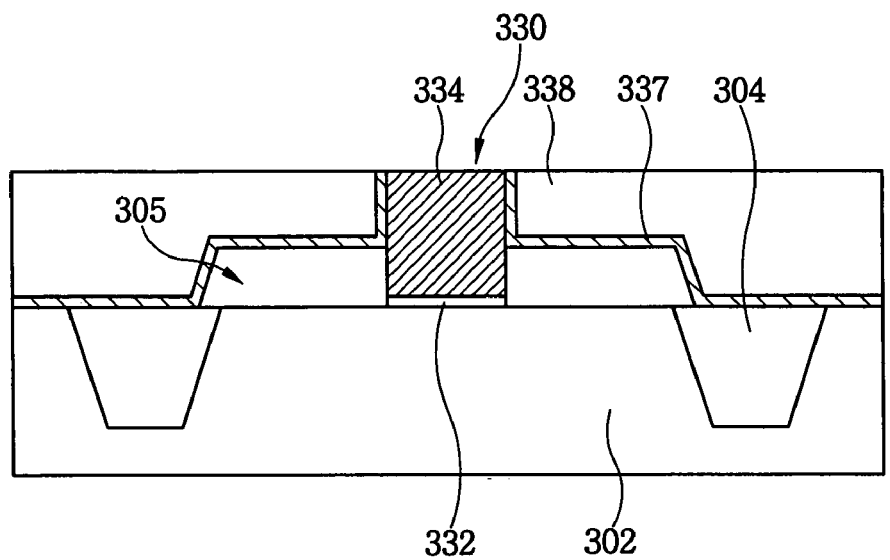

As shown in FIG. 9C, a silicon nitride film 337 is formed on the entire surface of the resulting structure of FIG. 9B. Next, a silicon oxide film 338 is formed, for example, by a CVD method. Next, the silicon oxide film 338 is subjected, for example, to a chemical mechanical polishing treatment, or an entire surface etching-back treatment, so as to planarize the surface of the silicon oxide film 338 and to expose the surface of the silicon nitride 334 as shown in FIG. 9D.

Figure 9E:
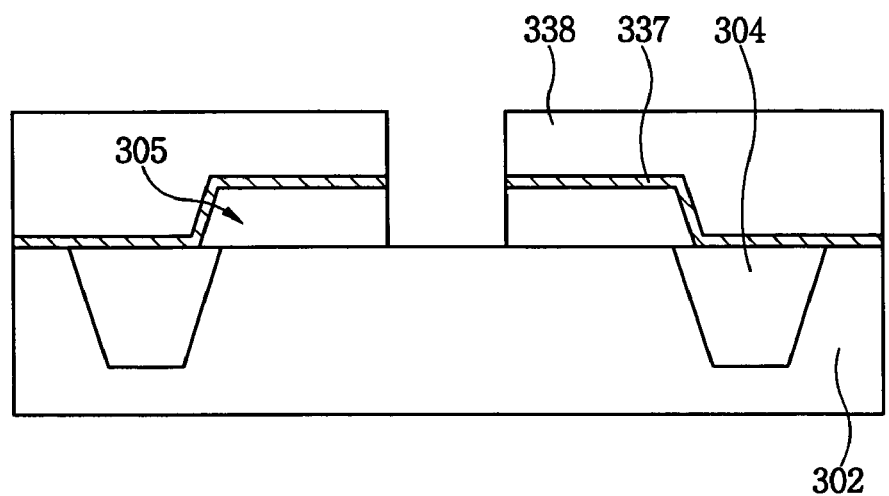

Referring to FIG. 9E, the dummy gate 330, including the silicon nitride film 334 and the silicon oxide film 332, is removed, exposing a portion of surface of the semiconductor substrate 302. Since the surface of the semiconductor substrate above the channel region is exposed, the channel impurity region may be optionally formed at this time, rather than forming the channel impurity region during formation of the well region as described above with respect to FIG. 9A. In this manner, the channel impurity region can be formed in the semiconductor substrate in a region that is localized to the area under the region of the now removed dummy gate pattern. This is especially beneficial for the FIG. 4 embodiment, which includes a trench formed in the semiconductor substrate, and a channel region formed under the trench.

Figure 9F:
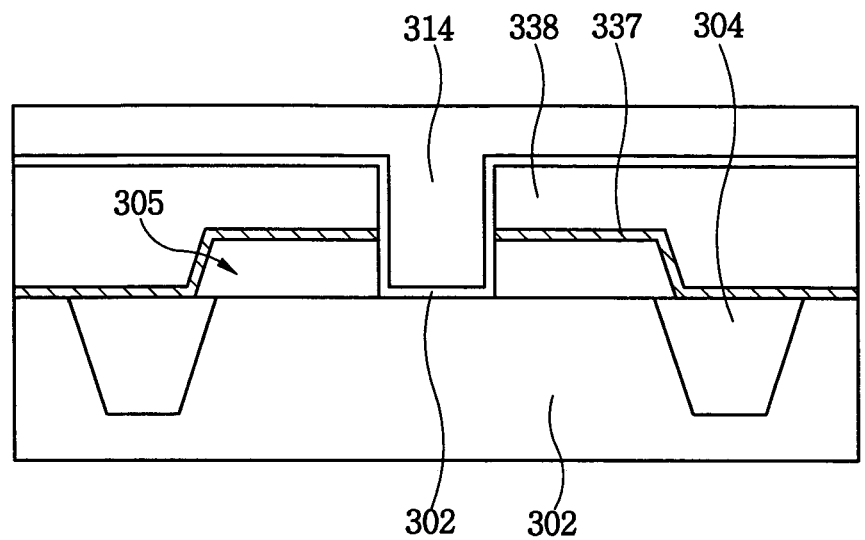
Figure 9G:
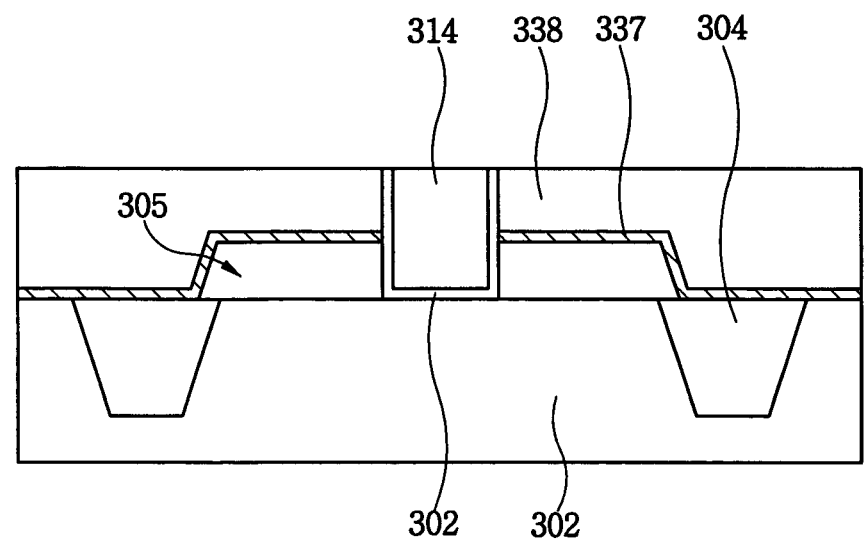
Figure 9H:
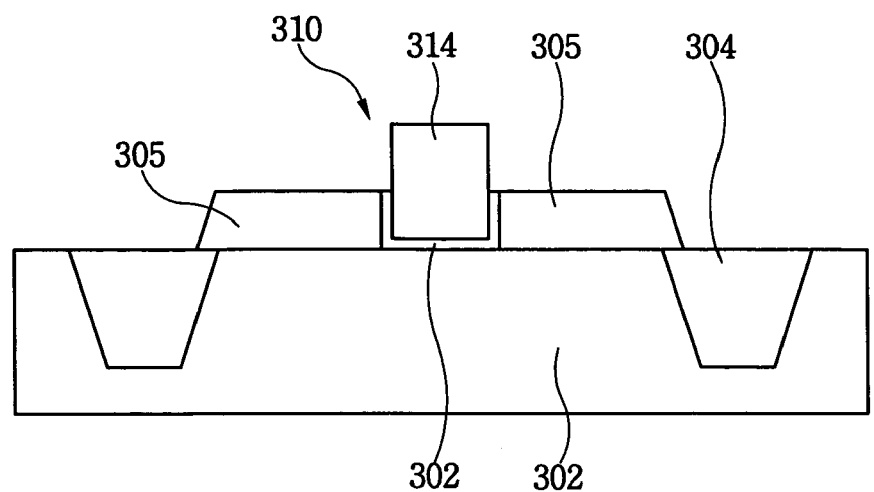

Referring to FIG. 9F, a gate dielectric 312 layer, for example of silicon oxide film, is formed on the exposed channel impurity region and the side walls of the epitaxial layer 305. The gate dielectric 312 layer may be formed of silicon oxide using a thermal oxidation process, or, alternatively, a deposition of high-dielectric-constant material such as silicon oxy-nitride (SiON), aluminum oxide, $HfO_2$, or tantalum oxide may be used. Next, a gate electrode 314, for example of polysilicon film, is deposited on the gate dielectric 312. The gate electrode 314 material may alternatively comprise, for example, a silicon germanium film, a silicide film, a tungsten film, a TiN film, or a metal film, or laminates thereof. With reference to FIG. 9G, the polysilicon film is next planarized, for example, by a chemical mechanical polishing treatment or a entire surface etch-back treatment to remove the upper portion of the gate dielectric layer 312 and to expose the silicon oxide film 338. Next, with reference to FIG. 9H, the silicon oxide 338 and silicon nitride 337 layers are removed, for example by a wet etching process, to form a gate structure 310.

Figure 9I:
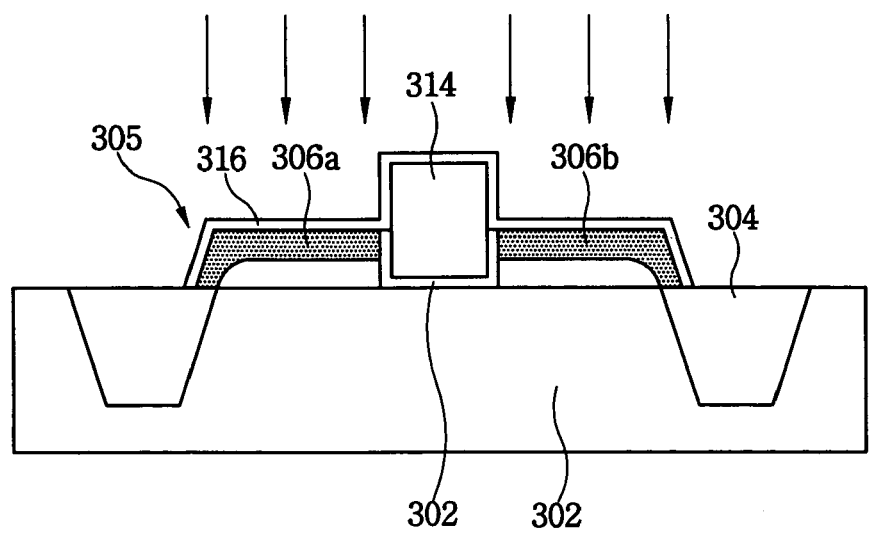

Next, as shown in FIG. 9I, impurities having an opposite conductivity type to that of the silicon substrate are implanted into the epitaxial layer 305 so as to form respective source extension and drain extension regions 306a, 306b. A pad oxide film 316, for example of silicon oxide material, formed by thermal oxidation or deposition, may optionally be formed on the epitaxial layer 305 as a buffer layer, in order to protect the surface of the epitaxial layer 305 from damage during the implanting process.

Figure 9J:
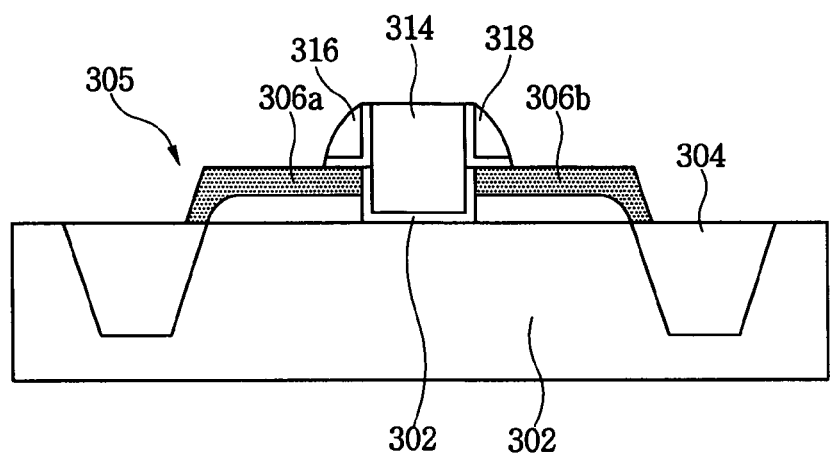

Referring to FIG. 9J, a silicon nitride (SiN) film is provided to cover the substrate, which is then subjected to anisotropic etching, or alternatively a dry etch process, so as to form spacers 318 on the upper sidewalls of the gate 310. The silicon oxide buffer layer 316 between the SiN spacer 318 and the other silicon layers, such as the gate electrode 314 and the epitaxial layer 305, remains following the anisotropic etch.

Figure 9K:
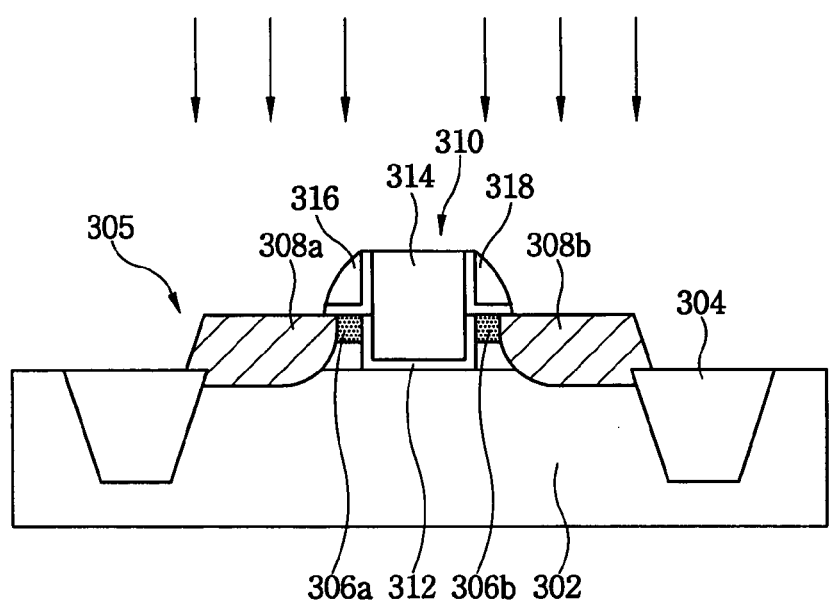
Figure 9L:
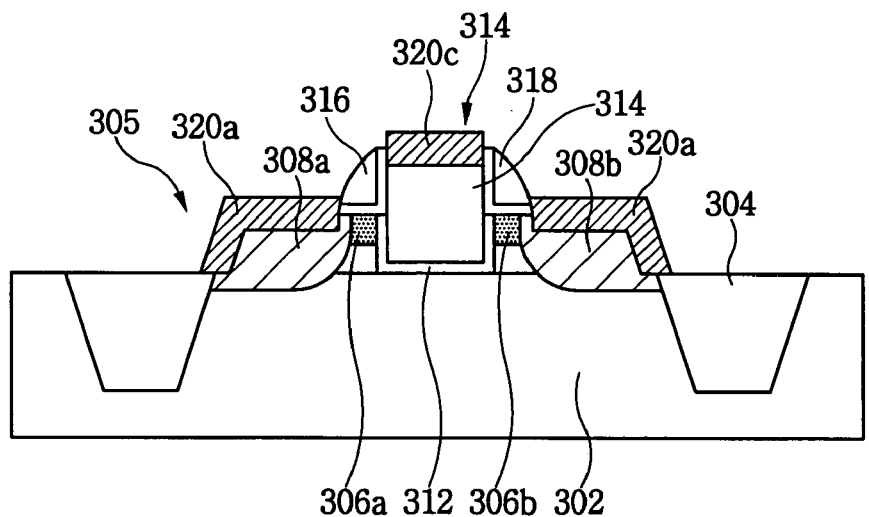

Referring to FIG. 9K, using the gate 310 and the spacers 318 as a mask, impurities having the same conductivity type as the source/drain extension regions 306a/306b are implanted into the epitaxial layer 305, so as to form a source region 308a and a drain region 308b. At this time, the source/drain extension regions 308a/308b remain under the spacers 318 and the source/drain regions 308a/308b are formed beside the spacers 318 in the epitaxial layer. The depth of the source and drain regions 308a, 308b is controlled according to the doping process, for example, according to the concentration of impurities and the length of time of exposure. Referring to FIG. 9L, a cobalt film is formed, for example, by a sputtering method, and then subjected to a heat treatment at a temperature ranging between 500° C. and 1000° C. in a nitrogen atmosphere or an argon atmosphere, so as to allow the cobalt film to react with the silicon in the epitaxial layer 305 and the gate 310, thereby to form cobalt silicide films 320a, 320b, and 320c in a self-aligned manner on exposed surfaces of the source/drain regions 308a/308b and the gate electrode 314, respectively. Unreacted cobalt film is then removed using conventional means. Alternatively, the silicide films may comprise other suitable materials, including Co, Ni, W, Ti, and combinations thereof.

In this manner, by deferring formation of the source/drain extension regions 306a/306b until after the gate electrode 314 is formed, fewer steps are required for fabrication of the transistor structure of the present invention. Alternatively, as stated above, the source/drain extension regions 306a/306b may be formed at the step shown in FIG. 9B, using the dummy gate pattern 330 as a mask. However, this approach requires additional steps.

Second Embodiment

A second embodiment of the invention is shown and described above with reference to FIG. 4. In the second embodiment, the gate electrode 414 is formed in a trench or a recessed portion 417 of the semiconductor substrate 402. Other components of the transistor configuration of the second embodiment are similar to those of the first configuration above, and therefore their description will be omitted here. Components of FIG. 4 having a reference numeral beginning with the prefix "4" and a unique suffix "4xx" share the same purpose as those components of FIG. 3, described above, having the same suffix "3xx".

A method of fabricating a semiconductor device according to the second embodiment of the present invention will now be described with reference to FIGS. 10A–10C.

Figure 10A:
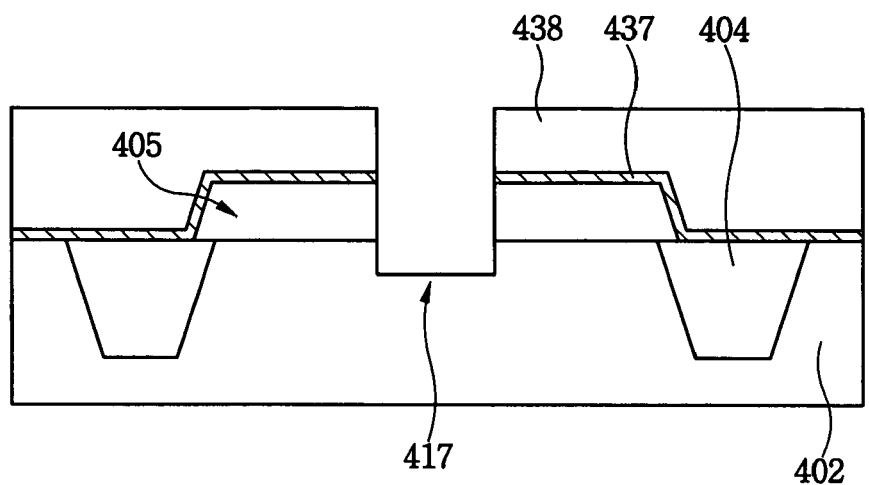
FIGS. 10A–10C are cross-sectional schematic views of a method for fabricating the MOS transistor of the second embodiment of the present invention.

The processes preceding the step shown at FIG. 10A are identical to those shown in FIGS. 9A–9D above with reference to the first embodiment.

Referring to FIG. 10A, the dummy gate, including the silicon nitride film and the silicon oxide film, is removed, exposing a portion of surface of the semiconductor substrate 302. The exposed surface of the semiconductor substrate is further subjected to etching in order to form a trench 417 or recessed region. The depth of the trench 417 is determined according to the desired channel length of the resulting device; the deeper the trench 417, the longer the effective channel length. In general, the depth of the trench 417 is less than 50 nm.

As explained above, since the surface of the semiconductor substrate above the channel region is exposed, the channel impurity region may be optionally formed at this time, rather than forming the channel impurity region during formation of the well region as described above with respect to FIG. 9A. In this manner, the channel impurity region can be formed in the semiconductor substrate in a region that is localized to the area under the region of the now removed dummy gate pattern. This is especially beneficial for the present embodiment, which includes a trench formed in the semiconductor substrate, and a channel region formed under the trench, since the channel region is not fully defined until the trench is formed.

Figure 10B:
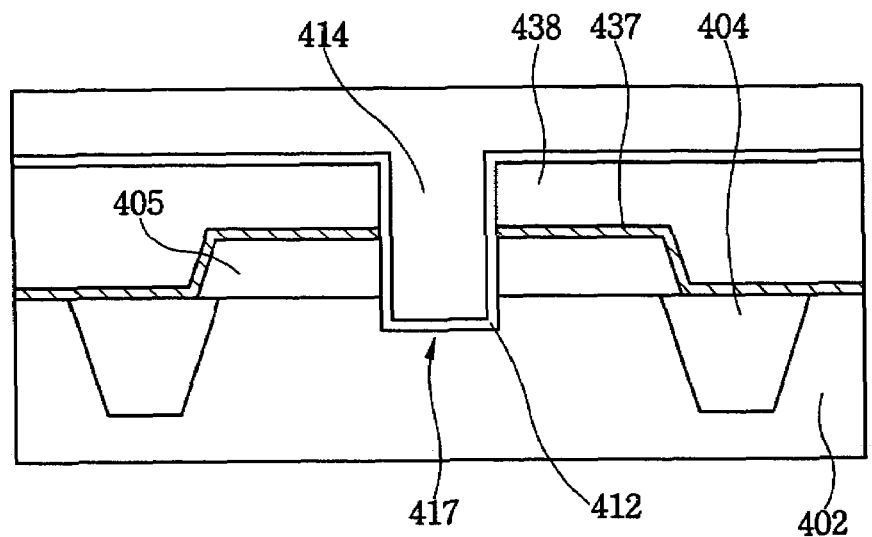
Figure 10C:
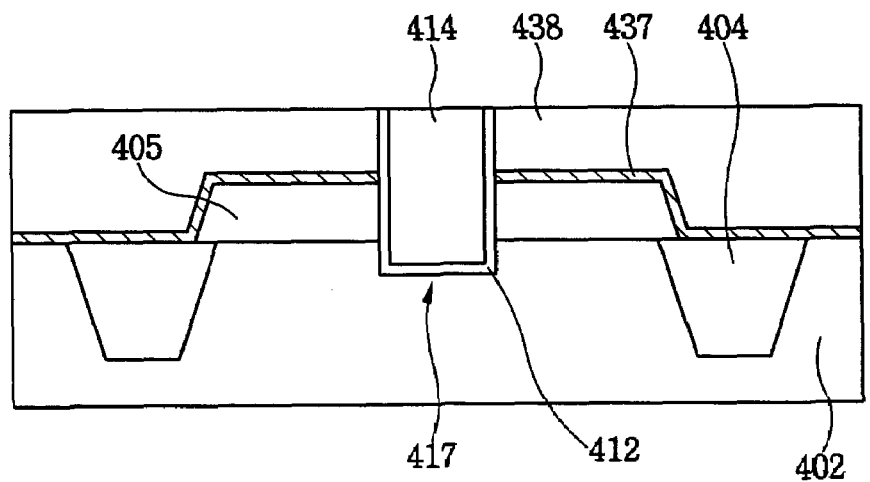

Referring to FIG. 10B, a gate dielectric 412 layer, for example of silicon oxide film, is formed on the exposed channel impurity region, the side walls of the trench 417, and the side walls of the epitaxial layer 405. As described above, the gate dielectric 412 layer may be formed of silicon oxide using a thermal oxidation process, or, alternatively, a deposition of high-dielectric-constant material such as silicon oxy-nitride (SiON), aluminum oxide, $HfO_2$, or tantalum oxide may be used. Next, a gate electrode 414, for example of polysilicon film, is deposited on the gate dielectric layer 412. The gate electrode 414 material may alternatively comprise, for example, a silicon germanium film, a silicide film, a tungsten film, a TiN film, or a metal film, or laminates thereof. With reference to FIG. 10C, the polysilicon film is next planarized, for example, by a chemical mechanical polishing treatment or a entire surface etch-back treatment to remove the upper portion of the gate dielectric layer 412 and to expose the silicon oxide film 438.

Thereafter, the processes are identical to those shown in reference to FIG. 9H to FIG. 9L explained in the first embodiment.

The performance characteristics of the resulting transistor can be accurately determined by controlling the respective geometries (i.e. depths and widths) of the source/drain extension regions, the source/drain regions, the channel width and the optional trench. In the various embodiments, the source/drain regions and the source/drain extension regions may extend partially, or fully, through the epitaxial layer, or even into the underlying semiconductor substrate.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A MOS transistor having elevated source and drain structures, comprising:
   a gate dielectric layer on a substrate;
   a gate electrode on the gate dielectric layer;
   an epitaxial layer contacting side portions of the gate dielectric layer on the substrate and extending from the gate dielectric layer substantially parallel to the substrate in a horizontal direction;
   first source/drain regions in the epitaxial layer contacting the side portions of the gate dielectric layer at lower side portions of the gate electrode; and insulating sidewall spacers on the first source/drain regions in the epitaxial layer at upper side portions of the gate electrode, bottom surfaces of the insulating sidewall spacers extending from the upper side portions of the gate electrode substantially parallel to the substrate.

2. The transistor of claim 1, wherein the gate dielectric layer extends across a bottom portion and the lower side portions of the gate electrode.

3. The transistor of claim 1, wherein the first source/drain regions are formed by doping the epitaxial layer with impurities.

4. The transistor of claim 1, further comprising second source/drain regions adjacent the first source/drain regions opposite the gate electrode.

5. The transistor of claim 4, wherein the second source/drain regions are formed by doping exposed surfaces with impurities using the gate electrode and the insulating sidewall spacers as masks.

6. The transistor of claim 4, wherein the first source/drain regions comprise source/drain extension regions and wherein the second source/drain regions comprise deep source/drain regions.

7. The transistor of claim 4, wherein depths of the first source/drain regions are less than depths of the second source/drain regions.

8. The transistor of claim 4, wherein the second source/drain regions extend into portions of the substrate.

9. The transistor of claim 3, wherein the first source/drain regions extend into portions of the substrate.

10. The transistor of claim 1, wherein the substrate is formed using one selected from the group consisting of silicon, silicon-on-insulator (SOI), SiGe, SiGe-on-insulator (SGOI), strained silicon, strained silicon-on-insulator, and GaAs.

11. The transistor of claim 1, wherein the epitaxial layer comprises. silicon or silicon germanium.

12. The transistor of claim 1, wherein the gate dielectric layer and the gate electrode extend into a trench formed in an upper portion of the substrate.

13. The transistor of claim 12, wherein the trench is of a depth that is less than about 50 nm.

14. The transistor of claim 1, further comprising a channel region in the substrate under the gate electrode and adjacent the lower side portions of the gate electrode.

15. The transistor of claim 1, wherein the gate dielectric layer comprises a material selected from the group of materials consisting of silicon oxide, silicon oxy-nitride (SiON), tantalum oxide, and a high-dielectric-constant material.

16. The transistor of claim 1, wherein the gate dielectric layer is formed using a deposition process or a thermal oxidation process.

17. The transistor of claim 1, wherein the gate electrode comprises a film selected from the group of materials consisting of a polysilicon film, a silicon geranium film, a silicide film, a metal film, and a laminate film.

18. The transistor of claim 1, further comprising a silicon oxide buffer layer between the gate electrode and the insulating sidewall spacers.

19. The transistor of claim 1, further comprising a silicide film on the first source/drain regions and the gate electrode.

20. The transistor of claim 19, wherein the suicide film comprises a material selected from the group consisting of Co, Ni, W, Ti and combinations thereof.

21. The transistor of claim 1 wherein the first source/drain regions are formed before formation of the insulating sidewall spacers.

* * * * *

UNITED STATES PATENT AND TRADEMARK OFFICE
CERTIFICATE OF CORRECTION

| | | |
|---|---|---|
| PATENT NO. | : 7,227,224 B2 | Page 1 of 1 |
| APPLICATION NO. | : 10/697826 | |
| DATED | : June 5, 2007 | |
| INVENTOR(S) | : Young-gun Ko | |

It is certified that error appears in the above-identified patent and that said Letters Patent is hereby corrected as shown below:

Column 12, line 2 delete "." after "comprises"

Column 12, line 28 delete "suicide" and insert --silicide--

Signed and Sealed this

Twentieth Day of November, 2007

JON W. DUDAS
*Director of the United States Patent and Trademark Office*